(12) United States Patent
Chen et al.

(10) Patent No.: US 9,337,028 B2
(45) Date of Patent: May 10, 2016

(54) PASSIVATION OF GROUP III-NITRIDE HETEROJUNCTION DEVICES

(71) Applicant: The Hong Kong University of Science and Technology, Hong Kong (CN)

(72) Inventors: Jing Chen, Kowloon (HK); Sen Huang, New Territories (HK); Qimeng Jiang, Kowloon (HK); Zhikai Tang, Kowloon (HK)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 0 days.

(21) Appl. No.: 14/585,636

(22) Filed: Dec. 30, 2014

(65) Prior Publication Data

US 2015/0111371 A1    Apr. 23, 2015

Related U.S. Application Data

(62) Division of application No. 13/895,511, filed on May 16, 2013, now Pat. No. 8,937,336.

(60) Provisional application No. 61/688,572, filed on May 17, 2012.

(51) Int. Cl.
  *H01L 21/02*     (2006.01)
  *H01L 29/66*     (2006.01)
  *H01L 29/778*    (2006.01)
  *H01L 29/20*     (2006.01)

(52) U.S. Cl.
  CPC ........ *H01L 21/0254* (2013.01); *H01L 21/0262* (2013.01); *H01L 21/02381* (2013.01); *H01L 21/02458* (2013.01); *H01L 21/02502* (2013.01); *H01L 21/02661* (2013.01); *H01L 29/66462* (2013.01); *H01L 29/7787* (2013.01); *H01L 29/2003* (2013.01)

(58) Field of Classification Search
  CPC ................... H01L 21/02502; H01L 29/66462; H01L 29/7787
  See application file for complete search history.

(56) References Cited

U.S. PATENT DOCUMENTS

| 5,270,263 | A  | 12/1993 | Kim et al. |
| 6,730,163 | B2 |  5/2004 | Vaartstra |
| 7,332,795 | B2 |  2/2008 | Smith et al. |
| 7,435,454 | B2 | 10/2008 | Brcka |

(Continued)

OTHER PUBLICATIONS

Tang, et al., High-Voltage (600-V) Low-Leakage Low-Current-Collapse AlGaN/GaN HEMTs With AlN/SiNx Passivation. IEEE Electron Device Letters, vol. 34, No. 3, Mar. 2013, 3 pages.

(Continued)

*Primary Examiner* — Thanh V Pham
(74) *Attorney, Agent, or Firm* — Amin, Turocy & Watson, LLP

(57) ABSTRACT

Passivation of group III-nitride hetero junction devices is described herein. The passivation facilitates simultaneous realization of effective/high current collapse suppression and low leakage current without the use of a sophisticated multiple-field plate technique. The passivation can be achieved by growing a charge-polarized AlN thin film on the surface of a group III-nitride based heterojunction device by plasma-enhanced atomic layer deposition such that positive polarization charges are induced at the interface to compensate for a majority of negative charges at the interface.

20 Claims, 15 Drawing Sheets

(56) References Cited

U.S. PATENT DOCUMENTS

| | | | |
|---|---|---|---|
| 7,622,322 | B2 | 11/2009 | Schaff et al. |
| 7,709,859 | B2 | 5/2010 | Smith et al. |
| 7,858,460 | B2 | 12/2010 | Rnig et al. |
| 2001/0023964 | A1 | 9/2001 | Wu et al. |
| 2005/0287824 | A1 | 12/2005 | Shapoval et al. |
| 2009/0045438 | A1 | 2/2009 | Inoue et al. |
| 2011/0235665 | A1 | 9/2011 | Simon et al. |
| 2012/0280281 | A1 | 11/2012 | Bahl |
| 2013/0092958 | A1 | 4/2013 | Chen et al. |

OTHER PUBLICATIONS

Koley, et al., "Slow Transients Observed in AlGaN HFETs: Effects of SiNx Passivation and UV Illumination," IEEE Transactions on Electron Devices, vol. 50, No. 4, pp. 886-893, Apr. 2003, 8 pages.

Selvaraj, et al., "AlN/AlGaN/GaN metalinsulator-semicondutor high-electron-mobility transistor on 4 in. silicon substrate for high breakdown characteristics," Applied Physics Letters, vol. 90, No. 17, pp. 173506-173506-4, Apr. 2007 (http://dx.doi.org/10.1063/1.2730751) Retrieved on Mar. 12, 2013, 4 pages.

Uemoto, et al., "8300V Blocking Voltage AlGaN/GaN Power HFET with Thick Poly-AlN Passivation," in IEDM Tech. Dig., 2007, pp. 861-864. 1-4244-0439-X/07/$25.00 © IEEE, Retrieved on Mar. 13, 2013, 4 pages.

Romero, et al., "Effects of N2 Plasma Pretreatment on the SiN Passivation of AlGaN/GaN HEMT," IEEE Electron Device Letters, vol. 29, No. 3. pp. 209-211, Mar. 2008, 3 pages.

Liu, et al., "Surface Passivation of AlGaN/GaN HFETs Using AlN Layer Deposited by Reactive Magnetron Sputtering", physica status solidi (c), No. 1, pp. 69-73, 2002. (c) 2002 WILEY-VCH Verlag GmbH & Co. KGaA, Weinheim. Retrieved on Aug. 14, 2013, 5 pages.

Alekseev, et al., "Low interface state density AlN/GaN MISFETs," Electronics Letters, vol. 35, No. 24, pp. 2145-2146, Nov. 25, 1999.

Hwang, et al., "Effects of a molecular beam epitaxy grown AlN passivation layer on AlGaN/GaN heterojunction field effect transistors," Solid-State Electronics, vol. 48, No. 2, pp. 363-366, Feb. 2004.

Lee, et al., "AlGaN/GaN metal-insulatorsemiconductor heterostructure field-effect transistor with an in-situ AlN cap layer," Applied Physics Letters, vol. 99, No. 15, pp. 153505-153505-3, Oct. 2011. Retrieved Aug. 17, 2013.

Edwards, et al., "Improved reliability of AlGaN-GaN HEMTs using an NH3 plasma treatment prior to SiN passivation," IEEE Electron Device Letters, vol. 26, No. 4, pp. 225-227, Apr. 2005.

Tanaka, et al., "Delay Time Analysis of AlGaN/GaN Heterojunction Field-Effect Transistors with AlN or SiN Surface Passivation," Japanese Journal of Applied Physics, vol. 48, No. 4, pp. 04C099-04C099-5, Apr. 2009.

Tsurumi, et al., "AlN Passivation Over AlGaN/GaN HFETs for Surface Heat Spreading," IEEE Transactions on Electron Devices, vol. 57, No. 5, pp. 980-985, May 2010.

Chu, et al., "1200-V Normally Off GaN-on-Si Field-Effect Transistors With Low Dynamic ON-Resistance," IEEE Electron Device Letters, vol. 32, No. 5, pp. 632-634, May 2011.

Vetury, et al., "The Impact of Surface States on the DC and RF Characteristics of AlGaN/GaN HFETs," IEEE Transactions on Electron Devices, vol. 48, No. 3, pp. 560-566, Mar. 2001.

Tan, et al., "Metal-organic chemical vapor deposition of quasi-normally-off AlGaN/GaN field-effect transistors on silicon substrates using low-temperature grown AlN cap layers," Applied Physics Letters, vol. 97, No. 5, pp. 053502-053502-3, 2010.

Hu, et al., "Si3N4/AlGaN/GaN metal—insulator—semiconductor heterostructure field—effect transistors," Applied Physics Letters, vol. 79, No. 17, pp. 2832-2834, Oct. 2001.

Chen, et al., "Effects of an AlN passivation layer on the microstructure and electronic properties of AlGaN/GaN heterostructures," Applied Physics A, vol. 90, No. 3, pp. 447-449, Oct. 2008.

Notice of Allowance dated Sep. 15, 2014 for U.S. Appl. No. 13/895,511, 26 pages.

PASSIVATION OF GROUP III-NITRIDE HETEROJUNCTION DEVICES

CROSS REFERENCE TO RELATED APPLICATION

This application is a divisional of, and claims priority to U.S. patent application Ser. No. 13/895,511, filed May 16, 2013, now U.S. Pat. No. 8,937,336 and entitled "PASSIVATION OF GROUP III-NITRIDE HETEROJUNCTION DEVICES," and claims priority to U.S. Provisional Patent Appln. No. 61/688,572, filed on May 17, 2012, and entitled: "A METHOD TO PASSIVATE GaN-BASED HETEROJUNCTION FIELD-EFFECT TRANSISTORS BY CHARGE-POLARIZED THIN FILM." The respective entireties of these applications are incorporated herein by reference.

TECHNICAL FIELD

This disclosure generally relates to a passivation of a group III-nitride heterojunction device by forming a charge-polarized aluminum nitride (AlN) thin film (with thickness of 10 nm or less) on a surface of the group III-nitride heterojunction device.

BACKGROUND

Group III-nitride heterojunction devices can deliver advantageous properties compared to their silicon and gallium arsenic counterparts for power switch applications. In applications with a high drain bias voltage, however, the group III-nitride heterojunction devices (e.g., in the form of heterojunction field-effect transistors) can suffer from surface-state-induced adverse effects, such as current collapse, due to a channel that is at a short distance (e.g., ~20 nm or less) from the polarized surface. When electrons are trapped at the surface, they can deplete electrons in the channel. As the HFET is turned on, the trapped electrons cannot be released or emitted fast enough, resulting in a partially depleted channel in the access region between the gate and drain terminals. Consequently, the transient ON-state current becomes smaller than the static ON-state current, and this is the so-called current collapse phenomenon in III-nitride lateral heterojunction devices.

Different passivation techniques have been utilized to reduce the adverse effects in group III-nitride applications. One technique employs $SiN_x$ as the passivation material to suppress the current collapse. $SiN_x$ passivation layers can be deposited using various chemical vapor deposition techniques such as plasma-enhanced chemical vapor deposition (PECVD) and low pressure chemical vapor deposition (LPCVD). The technique employing the $SiN_x$ passivation material has been effective in RF/microwave power amplifiers that typically require a moderate drain bias voltage (e.g., 28 V or 42 V). For power switching at high drain bias (>100 V), however, $SiN_x$-passivation alone is not adequate, and needs to be combined with sophisticated multiple field plates to achieve low current collapse at high drain bias switching.

Another technique employs aluminum nitride (AlN) as the passivation material. Compared to $SiN_x$, the AlN dielectric material exhibits higher breakdown voltage and dielectric constant, larger bandgap, better thermal conductivity and much smaller lattice mismatch to group III-nitrides, such as GaN. Due to these advantageous features, the AlN dielectric material has emerged as a compelling candidate for passivation of group III-nitride heterojunction devices. In situ metal-organic chemical vapor deposition (MOCVD), molecular beam epitaxy and sputtering are the three major techniques for growth of the AlN dielectric material on group III-nitride heterojunction devices. In MOCVD and MBE growth, the high growth temperatures (e.g. over 1000 degree Celsius in MOCVD and over 700 degree Celsius in MBE) result in large thermal budget that limits the thickness of high-quality AlN films without cracks. To prepare AlN thin film using sputtering, the possible surface damage induced by the high-energy sputtering ions makes the control of AlN/group III-nitride interface and the consequent passivation a challenging task.

Furthermore, the AlN thin films deposited by sputtering method are amorphous in nature, and thus, do not exhibit obvious spontaneous or piezoelectric polarization. With plasma-enhanced atomic layer deposition technique, it is possible to deposit epitaxial AlN thin film on c-plane III-nitride materials which exhibit strong spontaneous polarization. Thus, the epitaxial AlN thin film also exhibits strong charge polarization. This charge polarization in the AlN thin film is used to compensate the trap states at the interface between the AlN thin film and the surface of a III-nitride heterojunction structure.

The above-described background is merely intended to provide an overview of contextual information regarding group-III nitride hetero junction devices, and is not intended to be exhaustive. Additional context may become apparent upon review of one or more of the various non-limiting embodiments of the following detailed description.

SUMMARY

The following presents a simplified summary of the specification in order to provide a basic understanding of some aspects of the specification. This summary is not an extensive overview of the specification. It is intended to neither identify key or critical elements of the specification nor delineate any scope of particular embodiments of the specification, or any scope of the claims. Its sole purpose is to present some concepts of the specification in a simplified form as a prelude to the more detailed description that is presented later.

In accordance with one or more embodiments and corresponding disclosure, various non-limiting aspects are described in connection with the passivation of a group III-nitride hetero device. The passivation can allow the group III-nitride heterojunction device to achieve low current collapse and low leakage current simultaneously without the use of sophisticated multiple-field plate technique that is used in other passivation techniques.

The passivation can be achieved through the formation of a passivation layer of charge-polarized aluminum nitride (AlN) thin film (thickness 10 nm or less) on a surface of the group III-nitride heterojunction device (e.g., by plasma-enhanced atomic layer deposition). The charge-polarized AlN thin film facilitates the accumulation of fixed positive charge at a high charge density at the interface between the AlN thin film and the group III-nitride heterojunction device, which helps to compensate for the majority of negatively charged trap states at the interface between the AlN passivation layer and the group III-nitride heterojunction device. Using the polarization charge to compensate for the interface traps is an effective way of preventing current collapse in group III-nitride heterojunction devices. This is because the 2DEG in the access region between the gate and drain electrodes will never be depleted.

Since the passivation layer is typically deposited ex-situ with the epitaxial structures, interface trap states with high density are hard to avoid. The systems and methods described herein utilize a charge-polarized AlN thin layer to compensate for the trap states at the interface between the AlN thin turn passivation layer and the group III-nitride heterostructures. Using the polarization charge to compensate for the interface traps is an effective way to prevent current collapse in group III-nitride heterojunction devices.

In an embodiment, an apparatus is described that includes a group III-nitride heterojunction device and a charge-polarized AlN film on a surface of the group III-nitride heterojunction device. An interface between the group-III nitride heterojunction device and the AlN film has a density of positive polarization charges on the order of at least $10^{13}$ cm$^{-2}$. The AlN film can be a thin film with a thickness of 10 nm or less. The density of positive polarization charges can be any density so that the polarization charges can compensate for the majority (greater than half) of negative charges at the interface (e.g., due to electrons trapped at the interface states). In-situ remote plasma pre-treatment (using $NH_3$, Ar, $N_2$ plasma in various sequences) can be applied prior to the AlN thin film deposition so that the interface trap density is lower than the polarization charge density in the AlN film.

In another embodiment, a method is described that can facilitate passivation of a group III-nitride heterojunction device. The method includes growing a charge-polarized AlN thin film with a thickness of about 10 nm or less on a surface of a group III-nitride based heterojunction device by plasma-enhanced atomic layer deposition. The method also includes inducing positive polarization charges to compensate for at least a majority of negative charges at an interface between the surface of the group III-nitride based heterojunction device and the AlN thin film. For example, the density of the positive polarization charges at the interface can be at least $10^{13}$ cm$^{-2}$. The surface of the group III-nitride based heterojunction device can be cleaned in-situ with a $NH_3$—Ar—$N_2$ remote plasma pre-treatment just before the growth of the charge-polarized AlN thin film.

In a further embodiment, another method is described that can facilitate passivation of a group III-nitride heterojunction device. The method includes cleaning a surface of a group III-nitride based heterojunction device and forming a charge-polarized AlN film on the surface of the group III-nitride based heterojunction device. The cleaning can be a pre-treatment of the surface with remote plasmas or plasma precursors (e.g., $NH_3$—Ar—$N_r$) that can facilitate the cleaning. Both the cleaning and the forming can be performed at about the same temperature (e.g., 300 degrees Celsius). An interface between the surface of the group III-nitride heterojunction device and the AlN film comprises positive polarization charges with a density of at least $10^{13}$ cm$^{-2}$.

The following description and the drawings set forth certain illustrative aspects of the specification. These aspects are indicative, however, of but a few of the various ways in which the various embodiments of the specification may be employed. Other aspects of the specification will become apparent from the following detailed description of the specification when considered in conjunction with the drawings.

BRIEF DESCRIPTION OF THE DRAWINGS

Numerous aspects and embodiments are set forth in the following detailed description, taken in conjunction with the accompanying drawings, in which like reference characters refer to like parts throughout, and in which.

DETAILED DESCRIPTION

Figure 1:
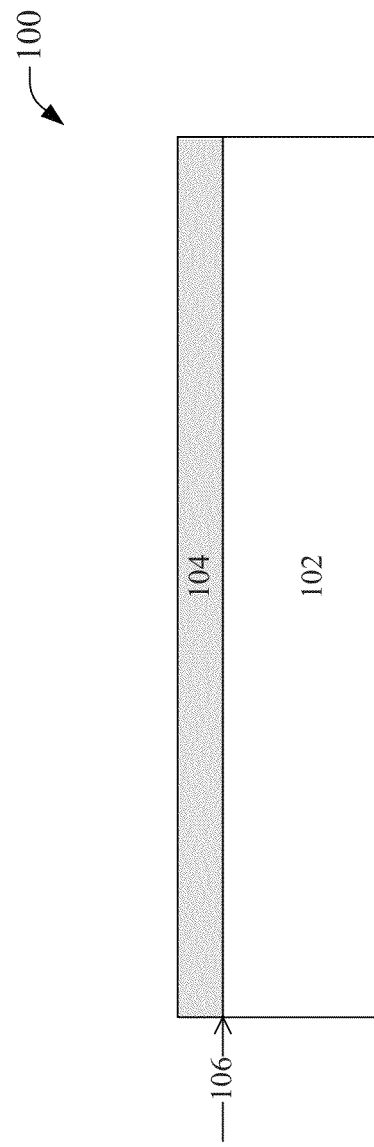
FIG. 1 is an example non-limiting schematic diagram of a group III-nitride heterojunction device with a passivation layer of charge-polarized AlN, according to an aspect or embodiment of the subject disclosure.

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that the certain aspects of disclosure may be practiced without these specific details, or with other methods, components, molecules, etc. In other instances, well-known structures and devices are shown in block diagram form to facilitate description and illustration of the various embodiments.

The subject application is generally related to the passivation of a group III-nitride hetero junction device using a charge-polarized aluminum nitride (AlN) thin film (thickness 10 nm or less). Since the passivation layer is typically deposited ex-situ with the epitaxial structures, interface trap states with high density are hard to avoid. The systems and methods described herein utilize an in-situ process to achieve a high density of positive polarization charges (on the order of $10^{13}$ $cm^{-2}$), induced by the charge-polarized AlN thin layer to compensate for the trap states at the interface between the AlN thin film passivation layer and the group III-nitride heterostructures. Using the polarization charge to compensate for the interface traps is an effective way to prevent current collapse in group III-nitride heterojunction devices.

A group III-nitride heterojunction device can also be referred to as a III-nitride heterojunction device. Group III-nitrides that can be used in heterojunction devices include, but are not limited to, gallium, aluminum, indium and combinations thereof-nitrides. Examples of group III-nitride heterojunction devices include, but are not limited to, heterojunction field-effect transistors (HFETs) and rectifiers, high electron mobility or high-electron-mobility transistors (HEMTs) and rectifiers, and Schottky diodes.

Group III-nitride heterojunction devices are attractive for use in many applications, such as RF power amplifiers and high voltage power switches. For example, GaN-based heterojunction devices are capable of delivering advantageous properties compared to their silicon and gallium arsenic (GaAs) counterparts. The advantageous properties provided by the GaN heterojunction devices include low ON-resistance, high breakdown voltage, fast switching speed, high power handling capability, and other advantageous capabilities, compared to silicon heterojunction devices and GaAs heterojunction devices. These advantages help to make GaN-based heterojunction devices attractive for many different applications, including power amplifier applications and power switch applications.

Referring now to FIG. 1, illustrated is an example non-limiting schematic diagram 100 of a group III-nitride heterojunction device 102 with a passivation layer 104 of charge-polarized AlN, according to an aspect or embodiment of the subject disclosure. The group III-nitride heterojunction device 102 can include any of gallium nitride, aluminum nitride, indium nitride or combinations of gallium, aluminum and/or indium nitrides. The group III-nitride heterojunction device 102 is passivated by the charge polarized AlN passivation layer 104. The AlN thin film is charge polarized when it single-crystalline or polycrystalline.

The charge polarized AlN film can be grown on a surface of the group III-nitride by plasma-enhanced atomic layer deposition (PEALD) that is conducted at a temperature as low as 300 degrees Celsius. PEALD allows the thickness of the AlN film to be well controlled.

The AlN grown on the surface of the group III-nitride heterojunction is generally a thin film (with a controlled thickness) formed on the surface of the group III-nitride heterojunction device 102. The "thin film" can be of any thickness less than or equal to 10 nm. In an embodiment, the thin film can be 10 nm thick or less. In another embodiment, the thin film can be 6 nm thick or less. In a further embodiment, the thin film can be 4 nm thick or less. The thin film AlN can be arranged in a monocrystalline-like arrangement, having a monocrystalline structure orientation or a polycrystalline structure. In other words, the thin film AlN can be a high quality AlN thin film.

The passivation of the group III-nitride heterojunction device 102 by the passivation layer 104 of charge-polarized AlN can be accomplished due at least in part of the polarization of the AlN within the passivation layer 104. The AlN is polarized so that a high density of positive polarization charges is introduced in the AlN film at the interface 106 between the AlN film and the group III-nitride heterojunction device 102.

Figure 2:
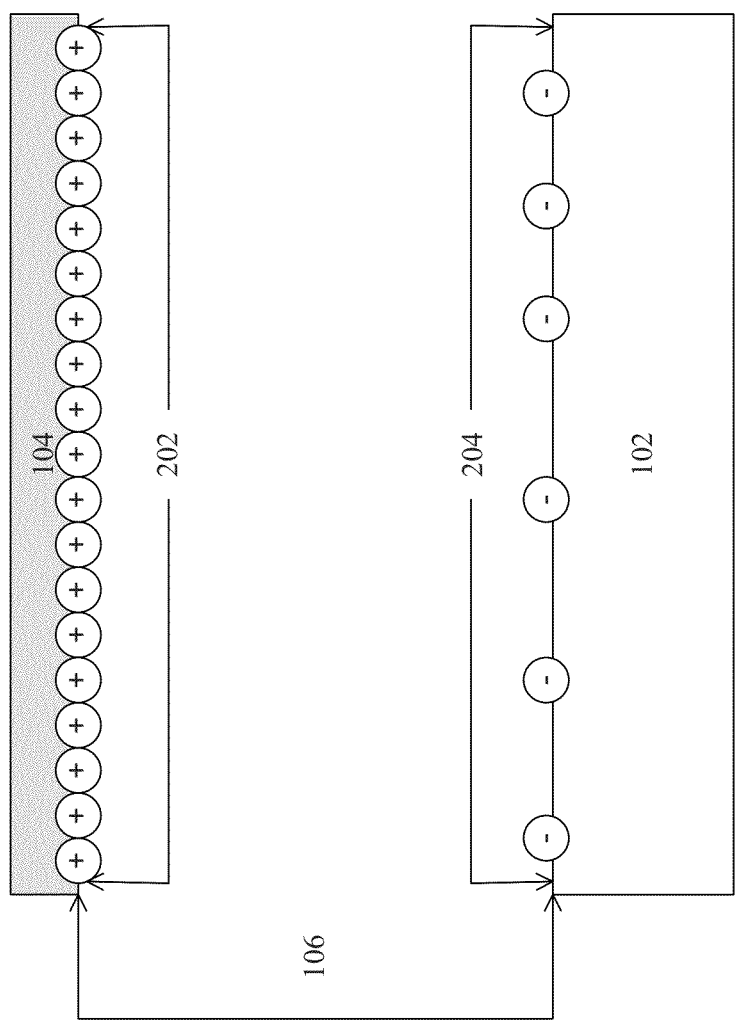
FIG. 2 is an example non-limiting schematic diagram of an interface between a group III-nitride heterojunction device and a passivation layer of charge-polarized AlN, according to an aspect or embodiment of the subject disclosure.

As illustrated in FIG. 2, the AlN film/group III-nitride interface undergoes two processes of charge generation and accumulation. First, a high density of positive polarization charges 202 (e.g., on the order of $10^{13}$ $cm^{-2}$) are introduced in the high quality AlN thin film as the film is formed. The positive polarization charges 202 are originated from spontaneous polarization within the AlN thin film (AlN is favorable for this phenomenon because AlN follows the polarization orientation of the group III-nitrides). These positive polarization charges 202 can be considered as fixed positive charges. Second, high density acceptor-like interface trap states are also created at the interface 106. The deep trap states tend to be filled with electrons and become negatively charged 204.

Since the positive polarization charges 202 feature a higher density than the trapped electrons, the net charge at the interface is positive, preventing the 2DEG channel from being depleted. In equilibrium, the high-density positive polarization charges already compensate for all deep levels (levels below the Fermi level) without sacrificing electrons in the 2DEG channel. The only uncharged interface traps are the ones closer to the conduction band and with shorter time constants. Any change of charge state in the deep traps will be effectively a reduction of the negative interface charges 204. In turn, the reduction of the negative interface charges 204 resists the depletion of the 2 DEG channel. Therefore, a key mechanism in the MN passivation of the group III-nitride heterojunction device 102 is the compensation of the interface traps by the polarization charges.

Figure 3:
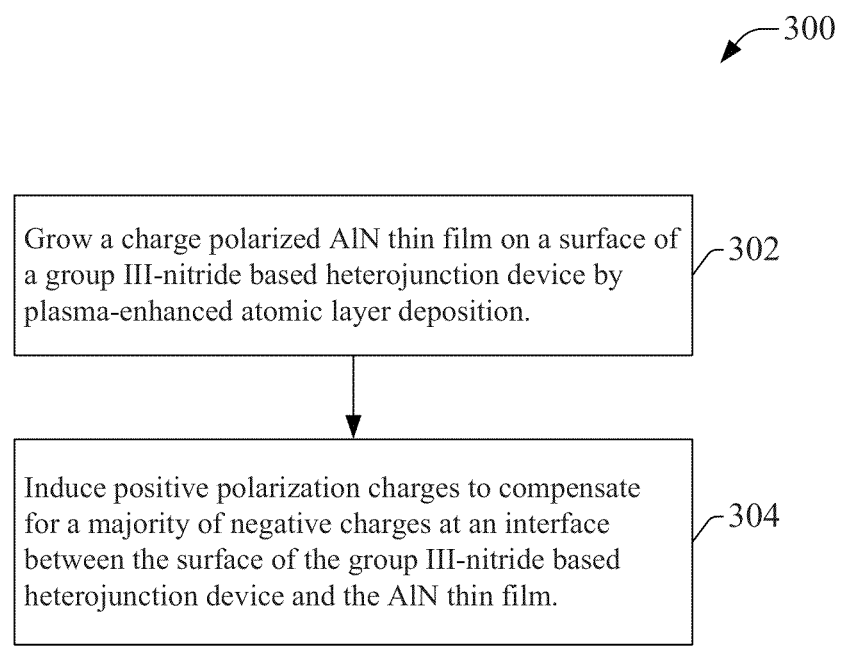
FIG. 3 is an example non-limiting process flow diagram of a method for passivation of a group III-nitride heterojunction device, according to an aspect or embodiment of the subject disclosure.
Figure 4:
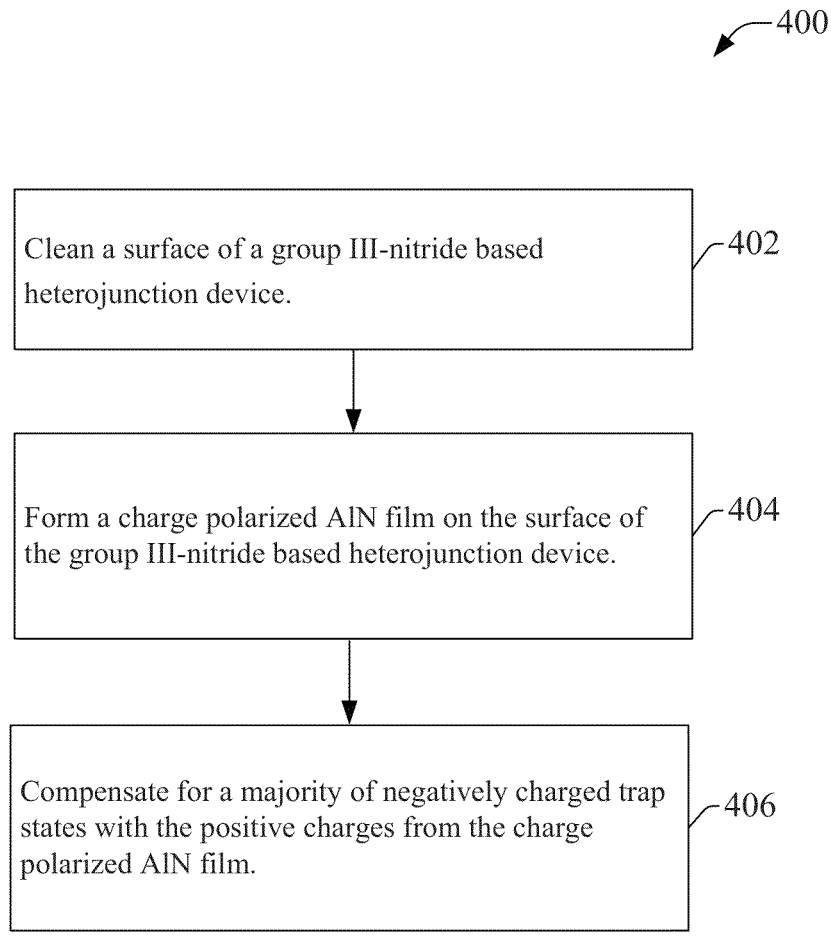
FIG. 4 is an example non-limiting process flow diagram of another method that facilitates passivation of a group III-nitride heterojunction device, according to an aspect or embodiment of the subject disclosure.
Figure 5:
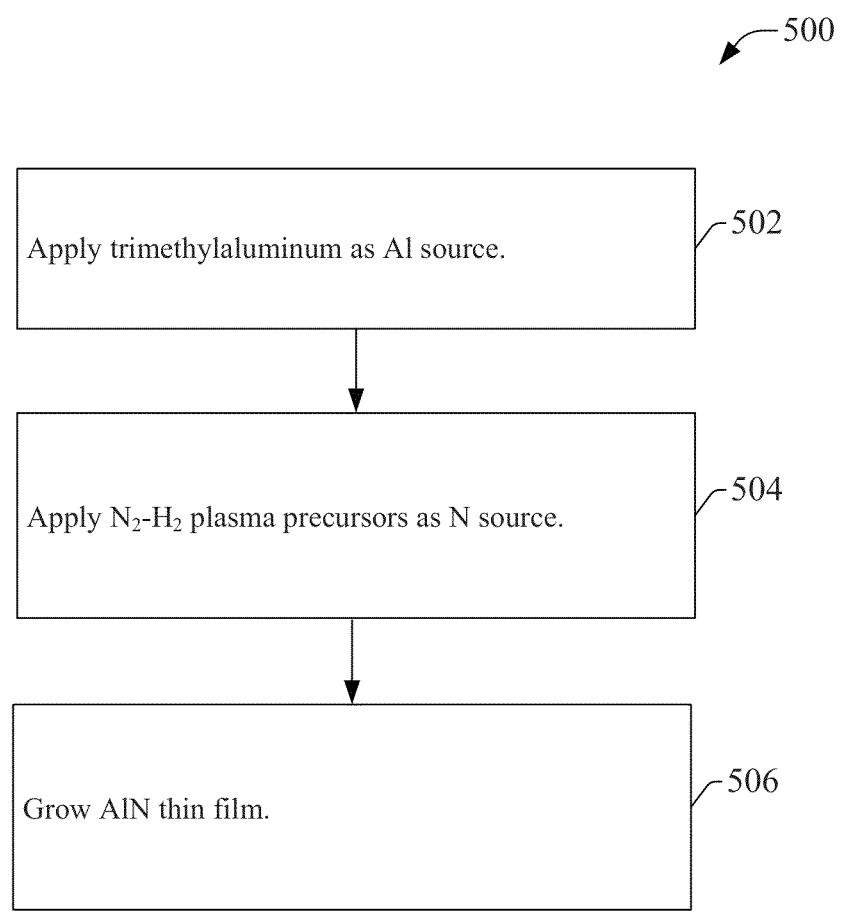
FIG. 5 is an example non-limiting process flow diagram of a method for plasma-enhanced atomic layer deposition, according to an aspect or embodiment of the subject disclosure.

FIGS. 3-5 illustrate methods 300-500 that facilitate the passivation of group III-nitride heterojunction devices by AlN thin film deposited on the surface of the group III-nitride heterojunction devices. For simplicity of explanation, the methods (or procedures) are depicted and described as a series of acts. It is to be understood and appreciated that the various embodiments are not limited by the acts illustrated and/or by the order of acts. For example, acts can occur in various orders and/or concurrently, and with other acts not presented or described herein.

Referring now to FIG. 3, illustrated is an example non-limiting process flow diagram of a method 300 for passivation of a group III-nitride heterojunction device, according to an aspect or embodiment of the subject disclosure. At element 302, a charge-polarized AlN thin film with a thickness of about 10 nm or less is grown on the surface of a group III-nitride based heterojunction device by plasma-enhanced atomic layer deposition. At element 304, positive polarization charges are induced to compensate for at least the majority of negative charges at the interface between the surface of the group III-nitride based heterojunction device and the AlN thin film. In an embodiment, the positive polarization charges compensate for all negative interface charges so that the interface exhibits a net positive charge.

A high density (on the order of $10^{13}$ cm$^{-2}$) of positive polarization charges (mainly originated from spontaneous polarization) can be introduced in the AlN film at the interface between the AlN and the group III-nitride. The positive polarization charges can compensate for the majority of the stow response interface trap states that cause the current collapse exhibited in other group III-nitride devices, specifically when the devices switch from a high drain bias.

The AlN film/group III-nitride interface undergoes two processes of charge generation and accumulation. First, a high density of positive polarization charges (on the order of $10^{13}$ cm$^{-2}$) are introduced in the high quality AlN thin film as the film is formed. The positive polarization charges are originated from spontaneous polarization within the AlN thin film (AlN is favorable for this phenomenon because AlN follows the polarization orientation of the group III-nitride). These positive polarization charges can be considered as fixed positive charges. Second, a high density of acceptor-like interface trap states are also created at the interface 106. The deep trap states tend to be filled with electrons and become negatively charged 204.

Since the positive polarization charges feature a higher density than the trapped electrons, the net charge at the interface is positive, preventing the 2DEG channel from being depleted. In equilibrium, the high-density positive polarization charges already compensate for all deep levels (levels below the Fermi level) without sacrificing electrons in the 2DEG channel. The only uncharged interface traps are the ones closer to the conduction band and with shorter time constants. Any change of charge state in the deep traps will be effectively a reduction of the negative interface charges 204. In turn, the reduction of the negative interface charges resists the depletion of the 2DEG channel. Therefore, a key mechanism in the AlN passivation of the group III-nitride heterojunction device 102 is the compensation of the interface traps by the polarization charges.

An in-situ low surface-damage pretreatment can be utilized in sequence as a surface cleaning method before the PEALD growth of the AlN. This is shown in FIG. 4, an example non-limiting process flow diagram of another method 400 that facilitates passivation of a group III-nitride heterojunction device, according to an aspect or embodiment of the subject disclosure.

At element 402, the surface of a group III-nitride based heterojunction device can be cleaned. The cleaning can be accomplished through an in-situ low surface-damage pretreatment. The pretreatment can use NH$_3$—Ar—N$_2$ remote plasma precursors (e.g., in an order of application of NH$_3$, Ar, N$_2$). The cleaning can be done just before the growth of the charge polarized AlN thin film. In an embodiment, the cleaning is a necessary step to increase the quality of the AlN thin film that is formed on the surface of the group III-nitride heterojunction device.

Accordingly, at element 404, a charge-polarized AlN film is formed on the surface of the group III-nitride based heterojunction device after the cleaning. The charge-polarized AlN film can be grown on the surface using a PEALD process. The PEALD process can utilize trimethylaluminum as the Al source and N$_2$—H$_2$ plasma precursors as the N source in the AlN growth. The formation of the AlN film and the cleaning can occur at about the same temperature (e.g., substrate temperature of about 300 degrees Celsius or above).

At element 406, the positive polarization charges from the charge-polarized AlN film can compensate for a majority of negatively charged trap states. The interface between the surface of the group III-nitride heterojunction device and the AlN film exhibits a density of positive polarization charges on an order of at least $10^{13}$ cm$^{-2}$ due to the polarized AlN film.

Referring now to FIG. 5, illustrated is an example non-limiting process flow diagram of a method 500 for plasma-enhanced atomic layer deposition, according to an aspect or embodiment of the subject disclosure. At element 502, trimethylaluminum can be applied to a group-III nitride device as the Al source. At element 504, N$_2$—H$_2$ plasma precursors can be applied to the group III-nitride device as the N source. At element 506, the AlN film is grown with a controllable thickness. For example, the thickness can be controlled to be 10 nm or less. In an embodiment, the plasma-enhanced atomic layer deposition can start after a cleaning of the group III-nitride device through an in-situ low surface-damage pretreatment process.

EXPERIMENTAL

Experimental results showing the feasibility of the passivation scheme using ultrathin polarized (single-crystalline or polycrystalline) AlN film grown by plasma-enhanced atomic layer deposition (PEALD) on the surface of a GaN-based power HEMT (an AlGaN/GaN HEMT) are now shown. The results obtained for the GaN-based power HEMTs can be extended to other group III-N heterojunction devices.

The passivation scheme using ultrathin polarized AlN film grown by advanced plasma-enhanced atomic layer deposition was demonstrated for GaN-based heterojunction field-effect transistors. Results suggest that a high density of positive fixed polarization charges are induced by the polarized ALD-grown AlN layer, and will be able to compensate for most of slow surface states that cause the current collapse in III-nitride power devices. Significant current collapse suppression and dynamic ON-resistance reduction are realized in the ALD-AlN-passivated AlGaN/GaN HEMTs under high-drain-bias switching conditions. An output power of 2.64 W/mm at 2 GHz is achieved on the passivated AlGaN/GaN HEMTs on silicon substrate without the use of field plate.

Sample Preparation

The sample used for demonstrating the passivation technique was a commercial Al$_{0.26}$Ga$_{0.74}$N/GaN HEMT wafer grown by MOCVD on (111) silicon substrate. It includes a 1.8 μm GaN buffer, a thin AlN (~1 nm) interface enhancement layer, an 18 nm undoped AlGaN barrier and a 2 nm undoped GaN cap.

The fabrication processes started with mesa etching. Ohmic contacts were formed by an alloyed Ti/Al/Ni/Au metal stack. The ohmic contacts could be also formed with other metal stacks that include Ti and Al. Ni/Au was used for the gate electrode.

Four samples with various surface conditions were then prepared: sample 1 (S1) without the remote plasma pretreatment (RPP) and passivation, sample 2 (S2) with HCl/NH$_4$OH cleaning and PECVD-grown 100 nm SiN$_x$ passivation, sample 3 (S3) with the RPP and atomic layer deposition (ALD)-AlN passivation, and sample 4 (S4) with the RPP only.

The in-situ remote plasma pretreatment (RPP) featured NH$_3$—Ar—N$_2$ plasma applied to the sample in sequence at a substrate temperature of 300° C. Atomic force microscopy confirmed that the RPP process is effective in removing the native oxide on the surface. For the ALD-AlN passivation of S3, a 4 nm AlN layer was deposited immediately after the RPP at 300° C., using N$_2$—H$_2$ and trimethylaluminum (TMA) plasma precursors as the N and Al sources. The growth rate is ~0.6 Å/cycle. For all the devices characterized in this work, the gate length L$_G$ and gate-source separation $L_{GS}$ are 1.5 and 1 µm, respectively. The gate-drain separation $L_{GD}$ is designed to be 2, 5 and 10 µm. All the measurements were performed with the substrate grounded unless specified otherwise.

Figure 8:
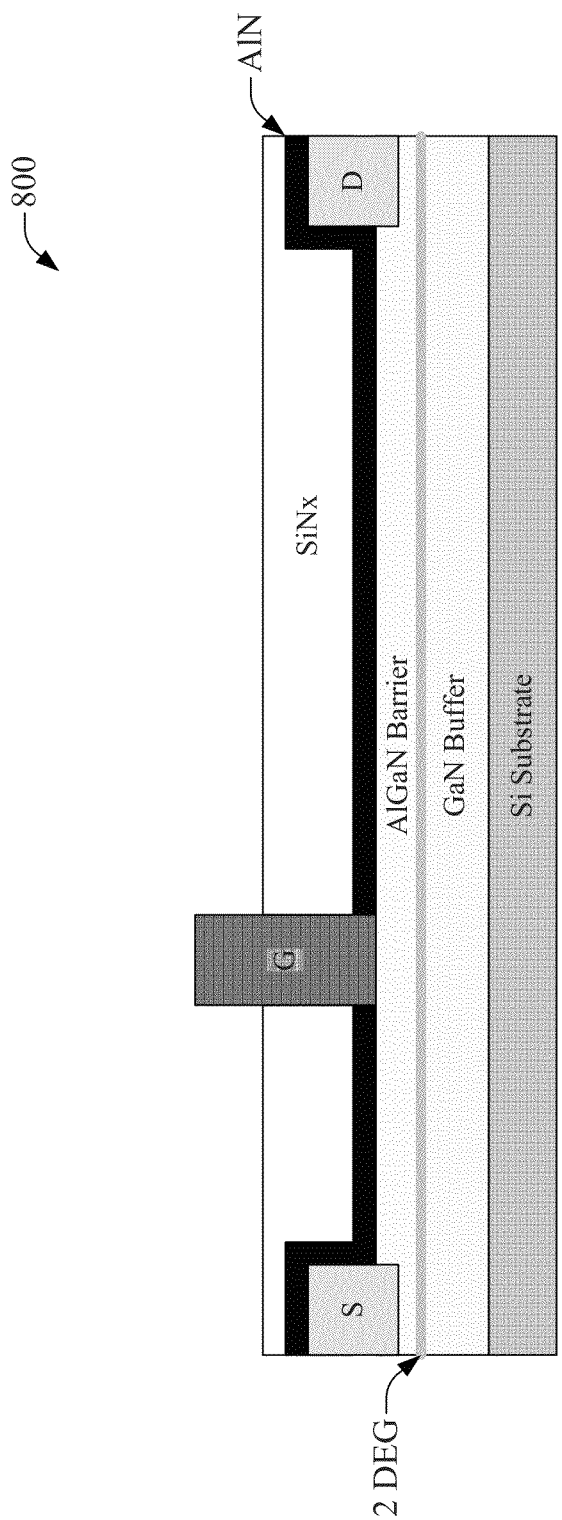
FIG. 8, is an example non-limiting block diagram illustrating passivation with an AlN/SiN$_x$ stack, with the AlN thin film deposited by plasma-enhanced atomic layer deposition and the SiN deposited by plasma-enhanced chemical vapor deposition, according to an aspect or embodiment of the subject disclosure.

The AlN passivation layer can be integrated with other dielectric materials used in device passivation. One example of the AlN passivation layer being integrated with other dielectrics ($SiN_x$) is shown in FIG. 8. It will be understood that the other dielectrics are not limited to $SiN_x$, which is shown for exemplary purposes only. The structure shown in FIG. 8 is based on the AlN passivation layer, and includes an additional $SiN_x$ cap (also referred to as an AlN/$SiN_x$ stack).

Determination Appropriate Experimental Thickness for AlN

Figure 6:
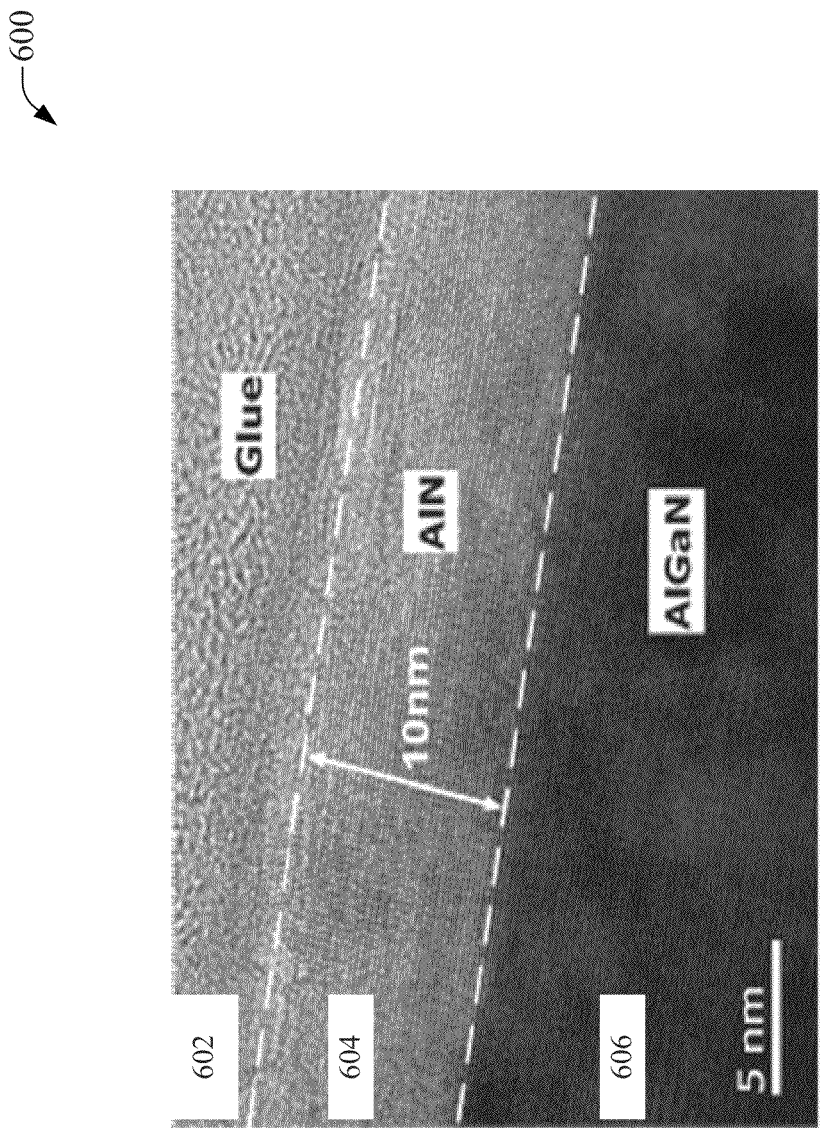
FIG. 6 is an example non-limiting high-resolution transmission electron microscopy (HRTEM) cross-sectional view of an interface between a 10 nm AlN layer formed by atomic layer deposition and an AlGaN/GaN high electron mobility transistor (HEMT), according to an aspect or embodiment of the subject disclosure.

A high-resolution transmission electron microscopy cross-sectional view 600 of the GaN-based power HEMT passivated by an AlN thin film is shown in FIG. 6. Element 606 is an AlGaN/GaN high electron mobility transistor (HEW). Element 604 is a 10 nm thick AlN film layer formed by atomic layer deposition on a surface of the AlGaN/GaN high electron mobility transistor (HEMT) 606. The cross-sectional view 600 of FIG. 6 shows an atomically sharp interface between the AlN film layer 604 and the surface of the AlGaN/GaN HEMT 606.

The GaN-based power HEMT 606 is passivated by an ultrathin (10 nm or less) charge-polarized AlN film 604 that is formed on the surface of the GaN by plasma-enhanced atomic layer deposition WEALD). The charge polarized AlN film contains a high density (on the order of $10^{13}$ cm$^{-2}$) of positive polarization charges at the interface between the AlN and the GaN-based HEMTs. The charge polarization and accumulation of positive polarization charges at the interface (mainly originated from spontaneous polarization) is thought to be due to the high crystal quality of the AlN film formed by PEALD and the atomically sharp interface obtained by the in-situ low-surface-damage RPP that is used with the PEALD.

The positive polarization charges at the interface can compensate for most of slow surface states that cause the current collapse in III-nitride power devices, resulting in significant reduction of the dynamic ON-resistance (dynamic $R_{on}$) in AlGaN/GaN HEMTs, specifically when the devices switch from high drain bias (>100 V). The effective suppression of the current collapse is further demonstrated by large-signal RF characteristics. An output power of 2.64 W/mm at 2 GHz is achieved on the AlN-passivated HEMTs on silicon substrate without the use of field plate.

Moreover, the AlN layer 604 featured a well-ordered atomic arrangement for the first several nanometers, indicating its monocrystal-like epitaxial quality. Regional polycrystalline domains appear at the top portion of the AlN layer. Atomic concentration of Al, N, O, Ga and C was measured by X-ray photoelectron spectroscopy (XPS) and plotted in the plot 700 as shown in FIG. 7.

Figure 7:
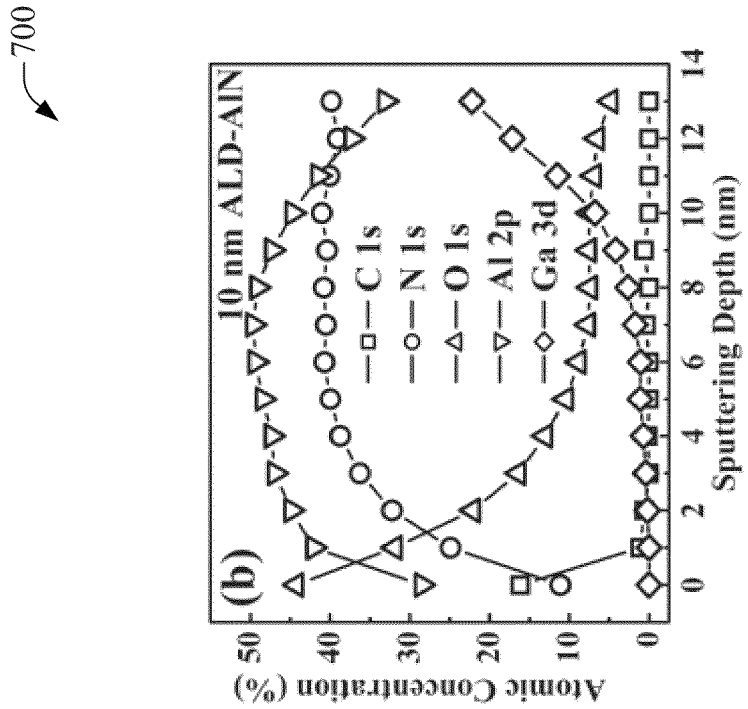
FIG. 7 is an example non-limiting X-ray photoelectron spectroscopy (XPS) plot of the atomic concentrations of Al, N, O, Ga and C within a 10 nm AlN layer formed by atomic layer deposition, according to an aspect or embodiment of the subject disclosure.

As shown in FIG. 7, near the AlN/GaN interface, low oxygen concentration (~8%) was observed compared to 41% nitrogen. Higher oxygen concentration was observed at the surface of the MN layer, suggesting oxidation of MN surface as it was exposed to air. In the XPS study, the Ga $2p_{3/2}$ core-level spectrum was used to monitor the Ga-related bonds. It was confirmed that Ga—O bonds are effectively removed by the RPP process. Therefore, based on the HRTEM characterization of the 10-nm AlN film, 4 nm thin AlN was used in the passivation of AlGaN/GaN HEMTs in the further experiments because of its high crystal quality.

Output Characteristics

Figure 9:
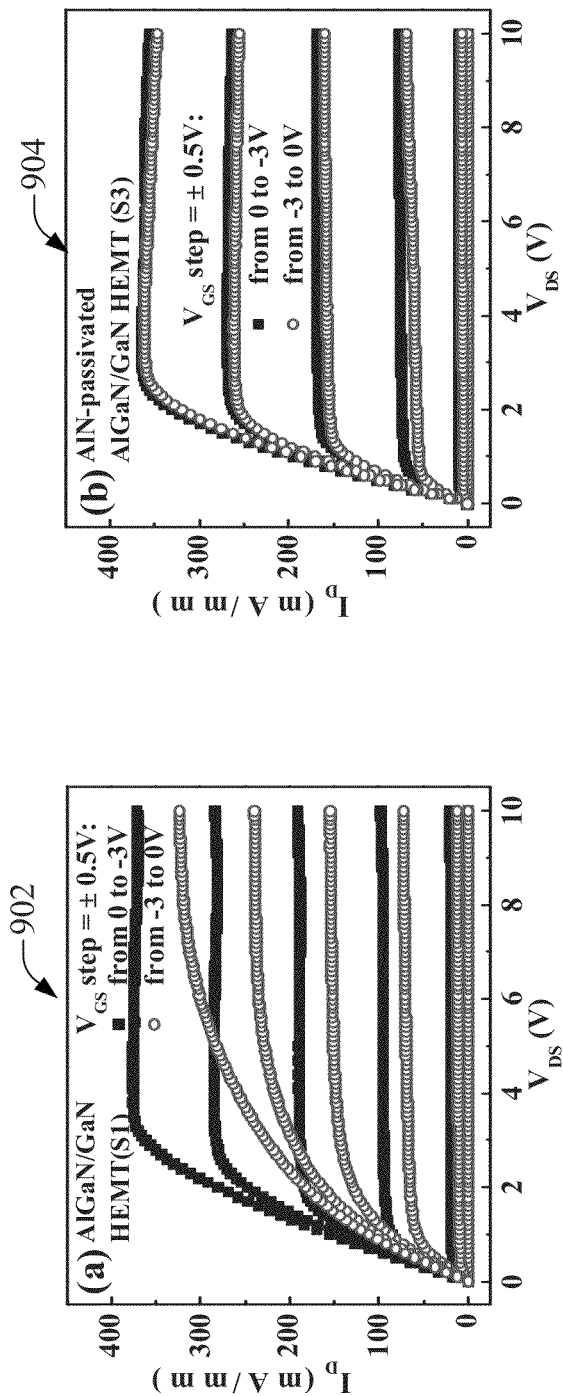
FIG. 9 shows example non-limiting plots of output characteristics of AlGaN/GaN HEMTs in different samples with the gate bias stepping up (or down) from (or toward) below the threshold voltage, according to an aspect or embodiment of the subject disclosure.

The output characteristics of samples S1 (without RPP and passivation) and S3 (with the RPP and ALD-AlN passivation) were measured with the gate bias stepping up (or down) from (or toward) below the threshold voltage, and the results are plotted in FIG. 8. In FIG. 9, element 902 corresponds to S1, element 904 corresponds to S3.

In S1, the output current is significantly lower at high gate bias when the gate bias is stepped up from below the threshold voltage, suggesting significant current collapse. In the AlN-passivated sample S3, very small discrepancies exist between the step-up and step-down measurements. This illustrates the advantages of RPP and ALD-AlN passivation.

To characterize the current collapse under large drain-bias switching, a measurement setup was configured using Agilent B1505A power device analyzer/curve tracer. The devices were first biased at the OFF-state by applying a gate bias ($V_{GS}$=−3 V used here) below the threshold voltage, while $V_{DS}$ was swept from 0.75 V (the chosen drain bias at the ON-state) to a preset value.

The sweeping time during the OFF-state stress was 46 s. Then the device was switched back to the ON-state by applying $V_{GS}$=0 V and $V_{DS}$=0.75 V at which an ON-state current higher than 100 mA/mm was obtained. The switching time was limited by the equipment at ~70 ms. The output resistance measured at the ON-state ($V_{GS}$=0 V and $V_{DS}$=0.75 V) right after the switching was used to evaluate the dynamic $R_{on}$. White tight was illuminated on the sample after each OFF-to-ON sweep to effectively refresh the devices.

Figure 10:
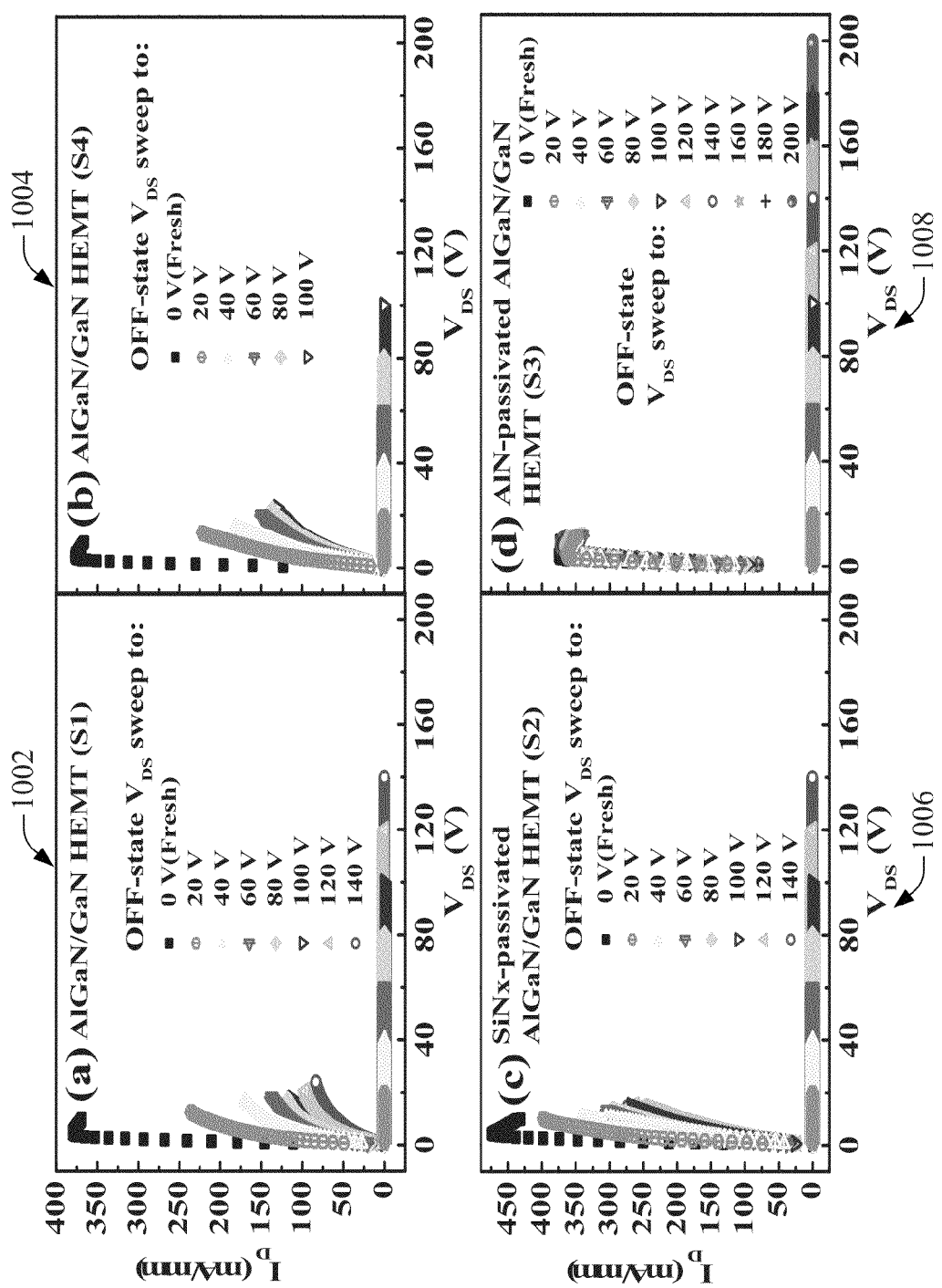
FIG. 10 shows example plots of output characteristics of AlGaN/GaN HEMTs in different samples with an initial bias to the OFF-state, according to an aspect or embodiment of the subject disclosure.

FIG. 10 shows the output characteristics measured by the method described above in S1 1002, S2 1006, S3 1008, and S4 1004. The ON-resistances measured from the "fresh" devices without any drain bias stress were regarded as the reference static $R_{on}$. The unpassivated devices S1 and S4 showed significant current collapse that became more severe as the OFF-state drain bias increased. $SiN_x$ passivation (S2) was shown to provide current collapse suppression, hut its effectiveness was limited under large drain bias. Meanwhile, the ALD-AlN-passivated device S3 exhibited much smaller current collapse.

Dynamic $R_{on}$ Characteristics

Figure 11:
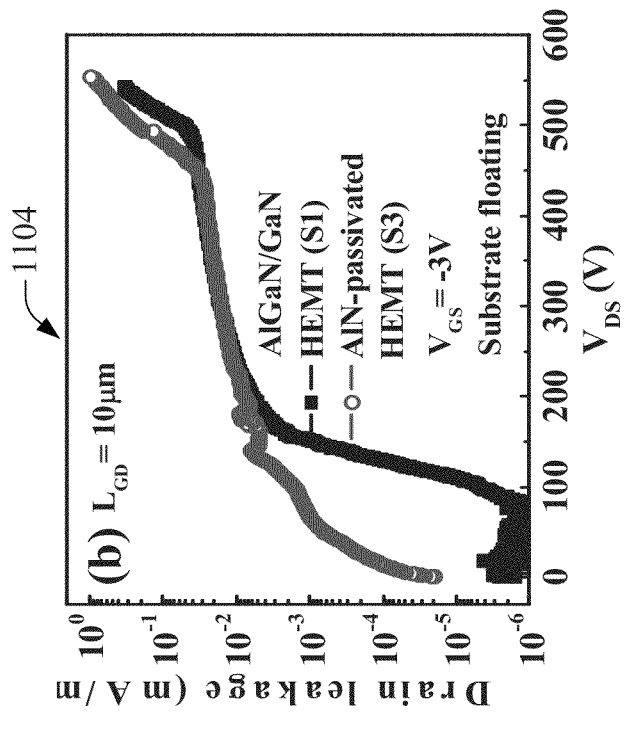
FIG. 11 shows example non-limiting plots illustrating the dynamic $R_{on}$ characteristics of devices with various values of $L_{GD}$ and OFF-state drain leakage characteristics of AlGaN/GaN HEMTs in different samples, according to an aspect or embodiment of the subject disclosure.
Figure 11:
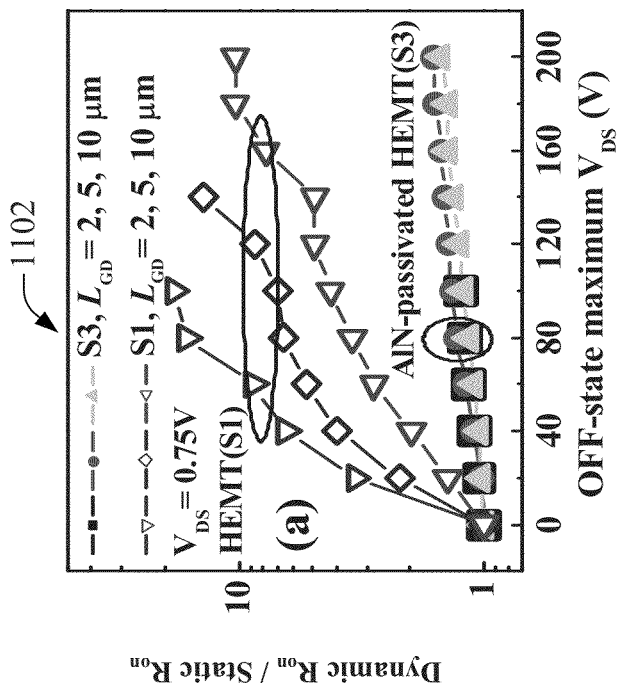

FIG. 11 shows example non-limiting plots illustrating the dynamic $R_{on}$ characteristics of devices with various values of $L_{GD}$ and OFF-state drain leakage characteristics of different samples of AlGaN/GaN HEMTs, according to an aspect or embodiment of the subject disclosure. For devices with various values of $L_{GD}$, the dynamic $R_{on}$'s are summarized in plot 1102. With ALD-AlN passivation, significant current collapse suppression and much lower dynamic $R_{on}$ are achieved. The OFF-state drain leakage characteristics in S1 and S3 are shown in plot 1104. At drain bias less than 160 V, the AlN-passivated device exhibits larger leakage, possibly due to the leakage through the polycrystalline AlN at the top. When the drain voltage exceeds ~160 V, the leakage through the AlN passivation layer is overwhelmed by the buffer leakage, and there is no obvious difference in the OFF-state leakage current between the two devices.

Figure 12:
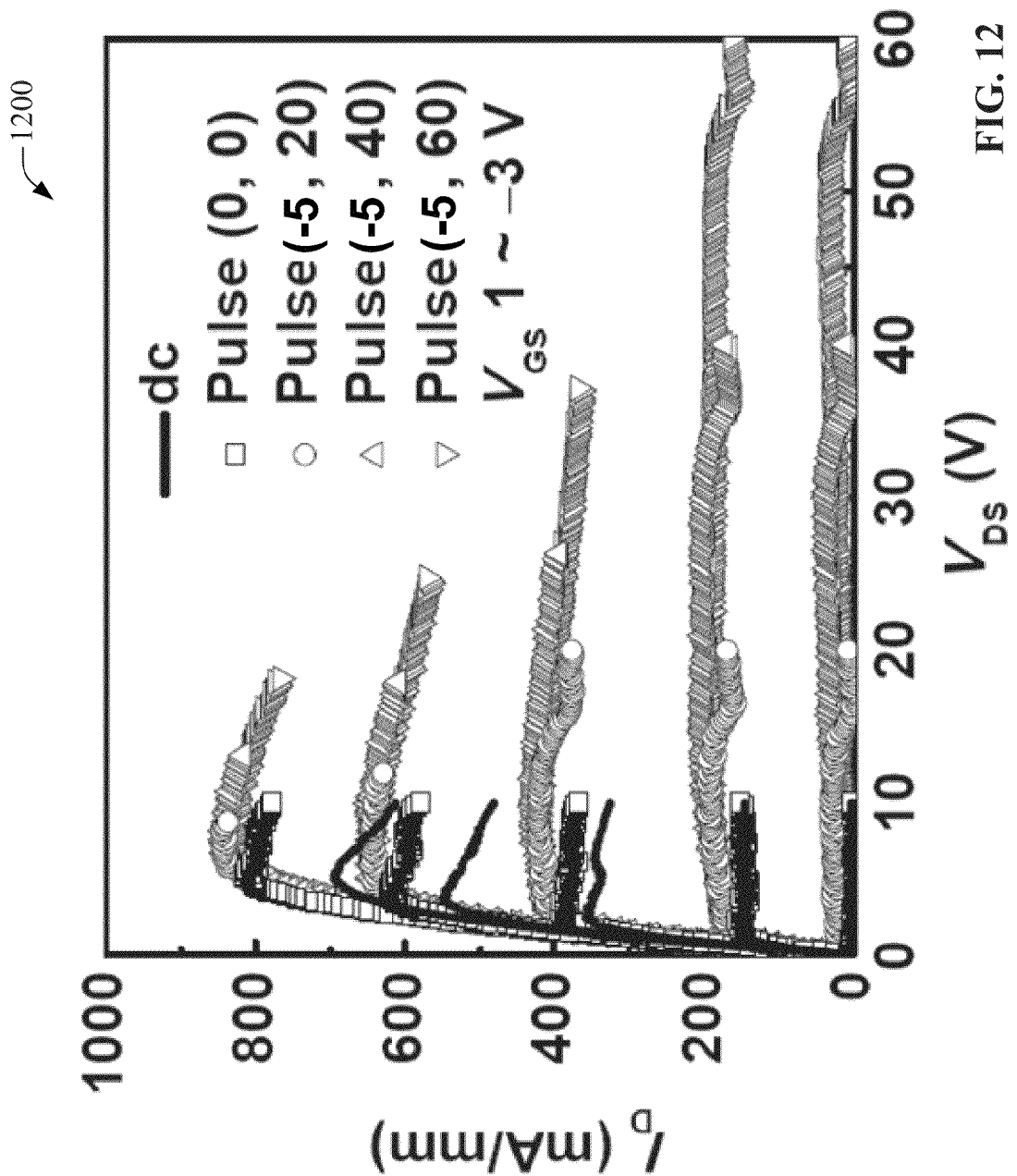
FIG. 12 is an example plot illustrating pulsed I-V characteristics of an AlGaN/GaN HEMT passivated by AlN/SiN$_x$ stack, according to an aspect or embodiment of the subject disclosure.

FIG. 12 shows the pulsed I-V characteristics measured from an AlGaN/GaN passivated with AlN/$SiN_x$ stack, as illustrated in FIG. 8. The pulse width is 500 ns and the pulse period is 7.5 µs. The quiescent gate and drain biases are set at (0 V, 0 V), (−5 V, 20 V), (−5 V, 40), and (−5 V, 60 V), respectively. The de static I-V characteristics are plotted as reference.

Passivation Mechanism

To reveal the physical mechanism of the improved passivation with such thin film AlN and its other possible applications (such as using AlN thin film as the gate dielectric), ALD-$Al_2O_3$/AlN (13/2 nm) dielectric stack (with a growth condition of the 2-nm AlN the same as the 4-nm AlN used herein), was also prepared and measured to exhibit similar excellent passivation performances as with 4-nm AlN single layer. Frequency-dependent capacitance-voltage (C-V) measurements as well as simulations confirmed that a high density of positive fixed charges (e.g., ~3.2×10$^{13}$ cm$^{-2}$) exists between the passivation stack and the III-nitride.

Figure 13:
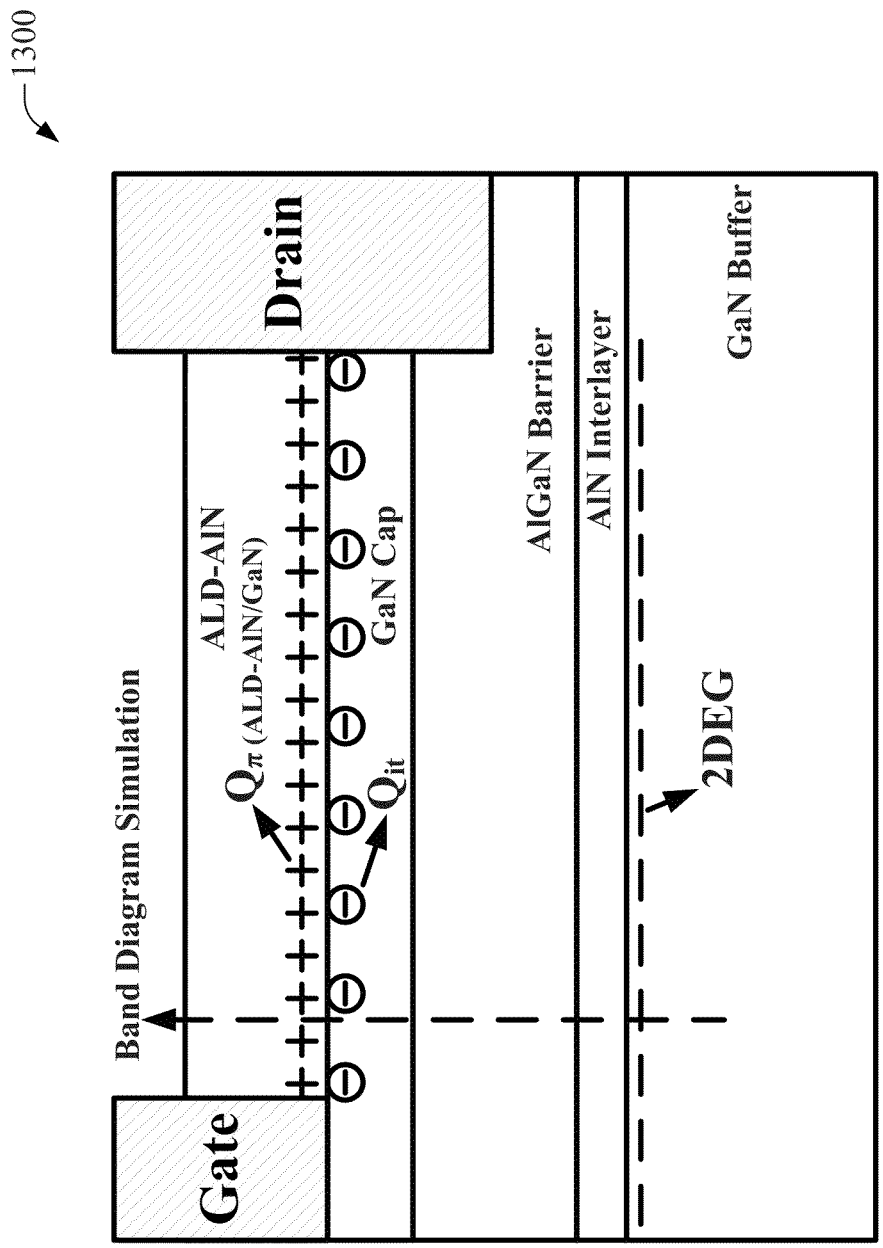
FIG. 13 is an example non-limiting schematic diagram of an atomic layer deposited-AlN-passivated AlGaN/GaN HEMT, according to an aspect or embodiment of the subject disclosure.

In view of the high crystal quality of the ALD-AlN, it is believed that the 4-nm AlN is polarized and thus induces a very high density of positive polarization charges $Q_{\pi(ALD-AlN/GaN)}$ at between the ALD-AlN and the group III-nitride, as shown in a cartoon 1300 of FIG. 13. The density of these positive fixed charges outweighs that of charged slow states $Q_{it}$ under OFF-state drain bias stress. The density of these slow states was determined to be ~2.0×10$^{13}$ cm$^{-2}$ (with an emission time constant longer than 1 ms) by C-V measurements and simulations. Therefore, the polarization charges induced by the polarized ALD-AlN is capable of compensating for at least most of the slow surface states even they are totally charged at high OFF-state drain bias, and thus remarkably suppress the current collapse.

Figure 14:
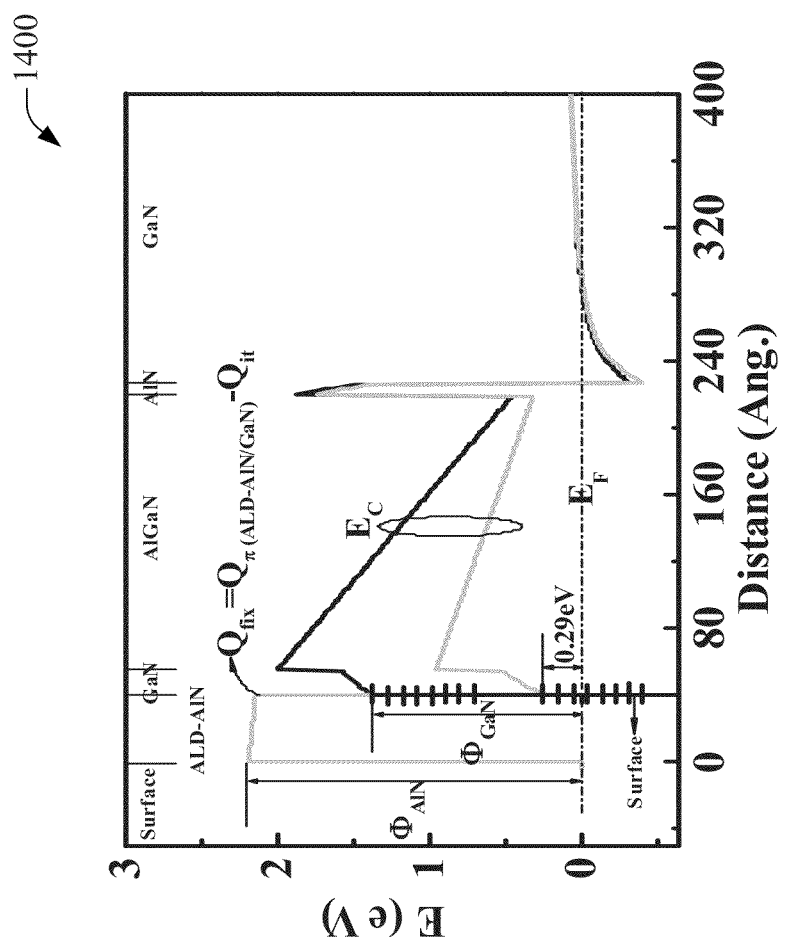
FIG. 14 is an example simulated energy band diagram of AlGaN/GaN HEMTs in the gate-drain access region before and after passivation with atomic layer deposited AlN, according to an aspect or embodiment of the subject disclosure.

FIG. 14 shows the energy band diagram 1400 in the gate-drain access region with total interface charges $Q_{\pi(ALD-AlN/GaN)}$-$Q_{it}$ being +2.0×10$^{13}$ cm$^{-2}$. It can be observed that most of the slow states at between the 4-nm ALD-AlN passivation and the GaN cap layer have been brought down to below Fermi level $E_F$ by the positive polarization charges. Their effect on the current collapse of the AlGaN/GaN HEMTs is thus significantly reduced.

Suppression of Current Collapse by Passivation with ALD-AlN

Figure 15:
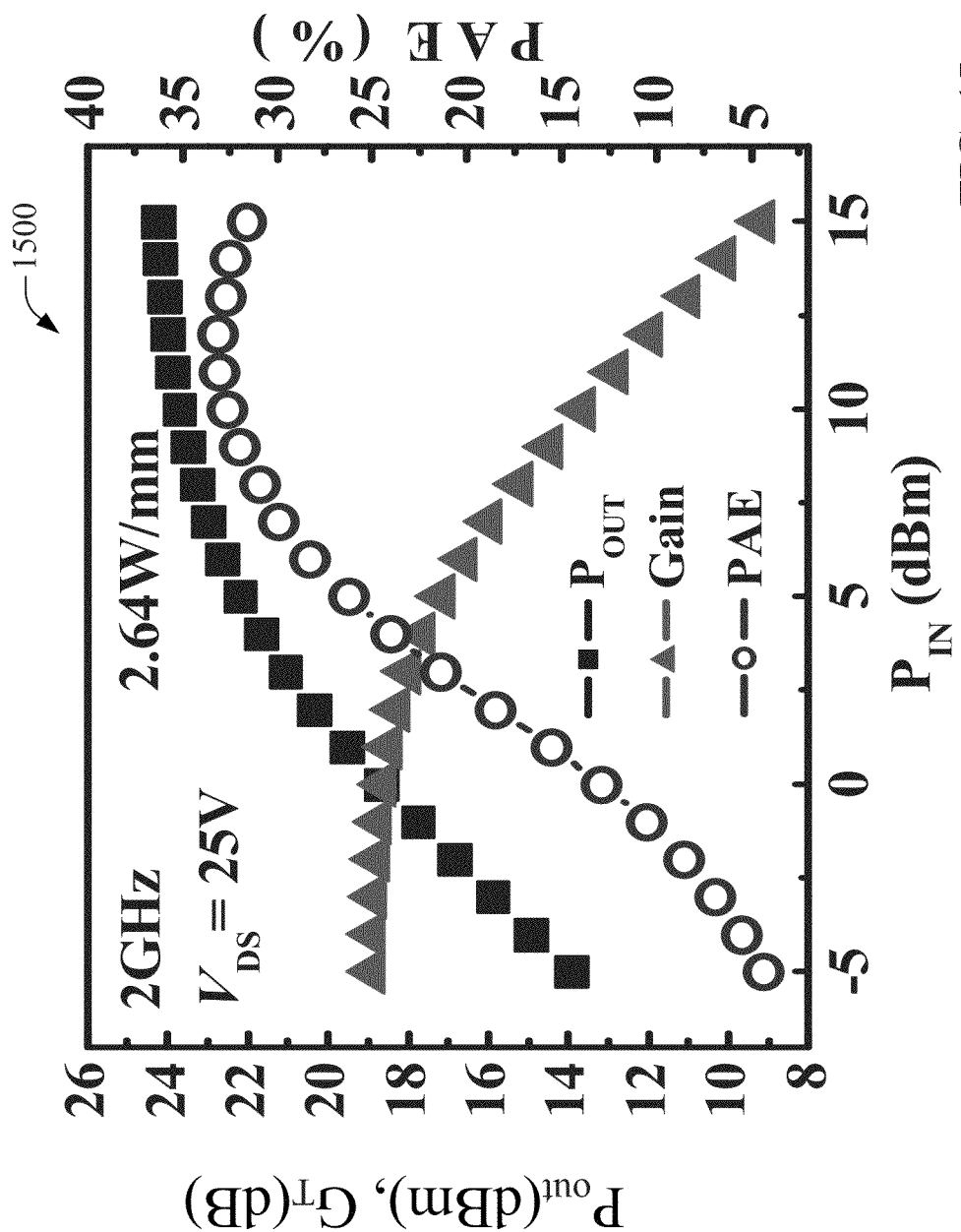
FIG. 15 is an example plot illustrating on-wafer large-signal RF characteristics at 2 GHz showing the suppression of current collapse by the passivation with AlN through atomic layer deposition, according to an aspect or embodiment of the subject disclosure.

FIG. 15 is an example plot 1500 illustrating on-wafer large-signal RF characteristics at 2 GHz showing the suppression of current collapse by the passivation with AlN through atomic layer deposition, according to an aspect or embodiment of the subject disclosure. The suppression of current collapse by the 4-nm ALD-AlN passivation is further demonstrated by on-wafer large-signal RF characteristics at 2 GHz. A $P_{OUT}$ of 2.64 W/mm, a linear gain of 19 dB, and a peak PAE of 33% were obtained on the ALD-AlN-passivated HEMTs without the use of field plate. The corresponding $P_{OUT}$ for the unpassivated HEMTs S1 is 0.47 W/mm. Moreover, the input power of the 1-dB compression point was increased from −7 (figures not shown to +3 dBm after the ALD-AlN passivation.

The above description of illustrated aspects and embodiments, including what is described in the Abstract, is not intended to be exhaustive or to limit the disclosed aspects and embodiments to the precise forms disclosed. While specific aspects and embodiments and examples are described herein for illustrative purposes, various modifications are possible that are considered within the scope of such aspects and embodiments and examples, as those skilled in the relevant art can recognize.

As used herein, the word "example" is used herein to mean serving as an example, instance, or illustration. For the avoidance of doubt, the subject matter described herein is not limited by such examples. In addition, any aspect or design described herein as an "example" is not necessarily to be construed as preferred or advantageous over other aspects or designs, nor is it meant to preclude equivalent structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

With respect to any numerical range for a given characteristic, a parameter from one range may be combined with a parameter from a different range from the same characteristic to generate a numerical range. Other than where otherwise indicated, all numbers, values, and/or expressions referring to quantities of ingredients, reaction conditions, etc., used in the specification and claims are to be understood as modified in all instances by the term "about."

In this regard, while the described subject matter has been described in connection with various aspects and embodiments and corresponding Figures, where applicable, it is to be understood that other similar aspects and embodiments can be used or modifications and additions can be made to the described aspects and embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims.

What is claimed is:

1. A method, comprising:
    growing a charge-polarized aluminum nitride (AlN) thin film with a thickness of about 10 nm or less on a surface of a group III-nitride based heterojunction device by plasma-enhanced atomic layer deposition; and
    inducing positive polarization charges in the charge-polarized AlN thin film at the interface between the charge-polarized AlN thin film and the surface of the group III-nitride heterojunction device to compensate for negative charges induced at the interface between the surface of the group III-nitride based heterojunction device and the charge-polarized, wherein the interface comprises a density of positive polarization charges on an order of at least about 10$^{13}$ cm$^{-2}$ AlN thin film.

2. The method of claim 1, further comprising treating the surface of the group III-nitride based heterojunction device with ammonia gas-argon gas-nitrogen gas ($NH_3$—Ar—$N_2$) remote plasma before the growth of the charge-polarized AlN thin film.

3. The method of claim 2, wherein the treating comprises applying the $NH_3$—Ar—$N_2$ remote plasma to the surface of the group III-nitride based heterojunction in an order of $NH_3$, then Ar, and then $N_2$.

4. The method of claim 1, wherein the plasma-enhanced atomic layer deposition occurs at a temperature from about 150 degrees Celsius to about 500 degrees Celsius.

5. The method of claim 4, further comprising pre-treating the surface of the group-Ill nitride based heterojunction device at a same temperature as the temperature of the plasma-enhanced atomic layer deposition.

6. The method of claim 1, wherein the plasma-enhanced atomic layer deposition utilizes trimethylaluminum and nitrogen gas-hydrogen gas ($N_2$—$H_2$) plasma precursors to facilitate the growth of the charge-polarized AlN thin film.

7. The method of claim 1, wherein the negative charges at the interface between the surface of the group III-nitride based heterojunction device and the charge polarized AlN thin film are due to charged surface states.

8. A method, comprising:
    cleaning a surface of a group III-nitride based heterojunction device; and
    forming a charge-polarized AlN film on the surface of the group III-nitride based heterojunction device,
    wherein an interface between the surface of the group III-nitride heterojunction device and the charge-polarized AlN film comprises a density of positive polarization charges on an order of at least about 10$^{13}$ cm$^{-2}$.

9. The method of claim 8, wherein the cleaning further comprises using ammonia gas-argon gas-nitrogen gas ($NH_3$—Ar—$N_2$) remote plasmas to facilitate the cleaning.

10. The method of claim 9, wherein the using the $NH_3$—Ar—$N_2$ remote plasmas comprises applying the $NH_3$—Ar—$N_2$ remote plasmas to the surface of the group III-nitride based heterojunction device in an order of $NH_3$, then Ar, then $N_2$.

11. The method of claim 9, wherein the cleaning is performed at a substrate temperature of at least about 300 degrees Celsius.

12. The method of claim 8, wherein the forming the charge-polarized AlN film comprises applying a plasma-enhanced atomic layer deposition with a nitrogen gas-hydrogen gas ($N_2$—$H_2$) mixed plasma precursor utilized as the source of nitrogen (N).

13. The method of claim 12, wherein trimethylaluminum is utilized as the source of aluminum (Al).

14. The method of claim 8, wherein the charge-polarized AlN film has a thickness less than 10 nanometers.

15. The method of claim 8, wherein the charge-polarized AlN film is a monocrystalline thin film.

16. A method, comprising:
depositing a charge-polarized aluminum nitride (AlN) film on a surface of a group III-nitride heterojunction device; and
forming an interface between the group III-nitride heterojunction device and the charge-polarized AlN film, wherein the interface comprises a density of positive polarization charges on an order of at least about $10^{13}$ $cm^{-2}$.

17. The method of claim 16, further comprising forming the charge-polarized AlN film to have a thickness of about 10 nm or less.

18. The method of claim 16, further comprising forming the charge-polarized AlN film to have a single-crystalline arrangement or a polycrystalline atomic arrangement.

19. The method of claim 16, wherein the density of positive polarization charges is greater than another density of negative charges at the interface.

20. The method of claim 16, further comprising forming a stacked passivation structure comprising the charge-polarized AlN film and a second dielectric material.

* * * * *